(12) United States Patent
Murata

(10) Patent No.: US 10,686,418 B1
(45) Date of Patent: Jun. 16, 2020

(54) METHODS AND APPARATUS FOR AN AMPLIFIER INTEGRATED CIRCUIT

(71) Applicant: SEMICONDUCTOR COMPONENTS INDUSTRIES, LLC, Phoenix, AZ (US)

(72) Inventor: Tsutomu Murata, Mizuho (JP)

(73) Assignee: SEMICONDUCTOR COMPONENTS INDUSTRIES, LLC, Phoenix, AZ (US)

(*) Notice: Subject to any disclaimer, the term of this patent is extended or adjusted under 35 U.S.C. 154(b) by 0 days.

(21) Appl. No.: 16/447,311

(22) Filed: Jun. 20, 2019

Related U.S. Application Data

(63) Continuation of application No. 16/447,149, filed on Jun. 20, 2019.

(51) Int. Cl.
*H03F 1/02* (2006.01)
*H03F 3/45* (2006.01)
*H03F 3/72* (2006.01)
*H03G 3/30* (2006.01)
*G01D 5/24* (2006.01)

(52) U.S. Cl.
CPC .......... *H03F 3/45475* (2013.01); *G01D 5/24* (2013.01); *H03F 1/0205* (2013.01); *H03F 3/45928* (2013.01); *H03F 3/72* (2013.01); *H03G 3/30* (2013.01); *H03F 2203/45514* (2013.01)

(58) Field of Classification Search
CPC ............... H03F 1/22; H03F 3/45; H03F 3/005

USPC .............................. 330/252, 254, 9; 327/124
See application file for complete search history.

(56) References Cited

U.S. PATENT DOCUMENTS

| 5,384,501 A * | 1/1995 | Koyama ............ G06G 7/184 327/336 |
|---|---|---|
| 2004/0080365 A1 | 4/2004 | Wentink |
| 2005/0179488 A1 | 8/2005 | Dvorak |
| 2012/0013351 A1 | 1/2012 | Daniel |
| 2012/0154028 A1 | 6/2012 | Kim |

FOREIGN PATENT DOCUMENTS

JP  2005072632 A  3/2005

* cited by examiner

*Primary Examiner* — Steven J Mottola
(74) *Attorney, Agent, or Firm* — The Noblitt Group, PLLC; Hettie L. Haines

(57) ABSTRACT

Various embodiments of the present technology may provide methods and apparatus for an amplifier integrated circuit. The amplifier integrated circuit may provide a low gain bandwidth product to amplify at a higher speed and a high gain bandwidth product to amplify at a lower speed. The amplifier integrated circuit may achieve the low and high gain bandwidth product by generating a first current and a second current through a plurality of sets of series-connected transistors and operating a plurality of switches.

19 Claims, 10 Drawing Sheets

US 10,686,418 B1

METHODS AND APPARATUS FOR AN AMPLIFIER INTEGRATED CIRCUIT

CROSS-REFERENCE TO RELATED APPLICATION

This application is a continuation of U.S. patent application Ser. No. 16/447,149, filed on Jun. 20, 2019, and incorporates the disclosure of the application in its entirety by reference.

BACKGROUND OF THE TECHNOLOGY

Many electrical systems utilize an amplifier to charge a switched capacitor. Conventional amplifiers are designed to charge the capacitor to a particular capacitance. However, if the charging time is fixed to a short period, an amplifier needs to be set to operate at high speed to suit the electrical charging time. If an amplifier is set to operate at high speed, a wide range of thermal noise is amplified raising the noise of the amplifier circuit. While methods to reduce noise level exist, such as including an adding function at the amplifier output, these methods have the undesirable effect of increasing the circuit size and increasing the calculation period.

SUMMARY OF THE INVENTION

Various embodiments of the present technology may provide methods and apparatus for an amplifier integrated circuit. The amplifier integrated circuit may provide a low gain bandwidth product to amplify at a higher speed and a high gain bandwidth product to amplify at a lower speed. The amplifier integrated circuit may achieve the low and high gain bandwidth product by generating a first current and a second current through a plurality of sets of series-connected transistors and operating a plurality of switches.

BRIEF DESCRIPTION OF THE DRAWING FIGURES

A more complete understanding of the present technology may be derived by referring to the detailed description when considered in connection with the following illustrative figures. In the following figures, like reference numbers refer to similar elements and steps throughout the figures.

DETAILED DESCRIPTION OF EXEMPLARY EMBODIMENTS

The present technology may be described in terms of functional block components and various processing steps. Such functional blocks may be realized by any number of components configured to perform the specified functions and achieve the various results. For example, the present technology may employ various filters, amplifiers, transistors, resistive elements, switching devices, and the like, which may carry out a variety of functions. In addition, the present technology may be practiced in conjunction with any number of electronic systems, such as automotive, aviation, "smart devices," portables, and consumer electronics, and the systems described are merely exemplary applications for the technology.

Figure 1:
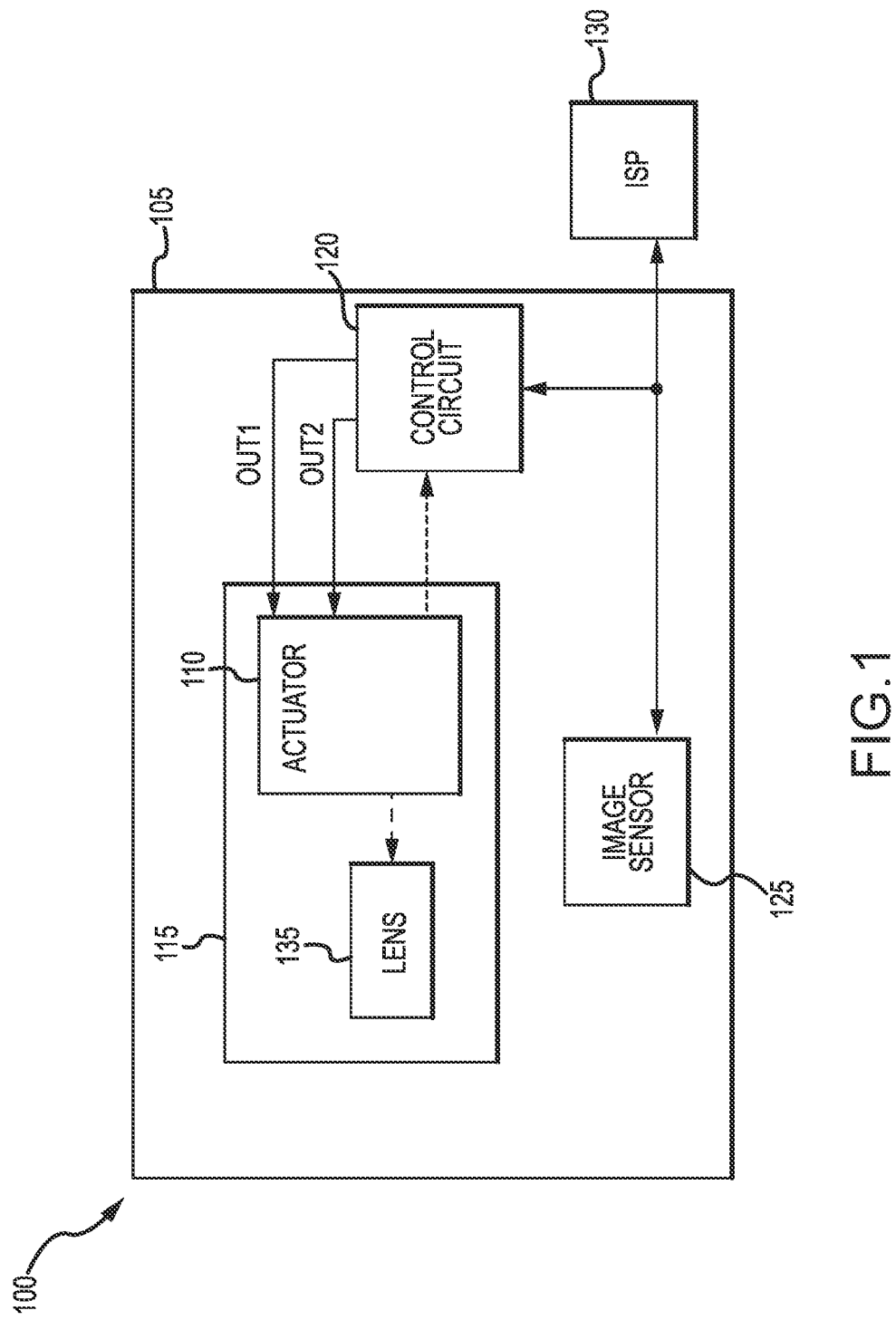
FIG. 1 is a block diagram of a camera autofocus device in accordance with an exemplary application of the present technology.
Figure 2:
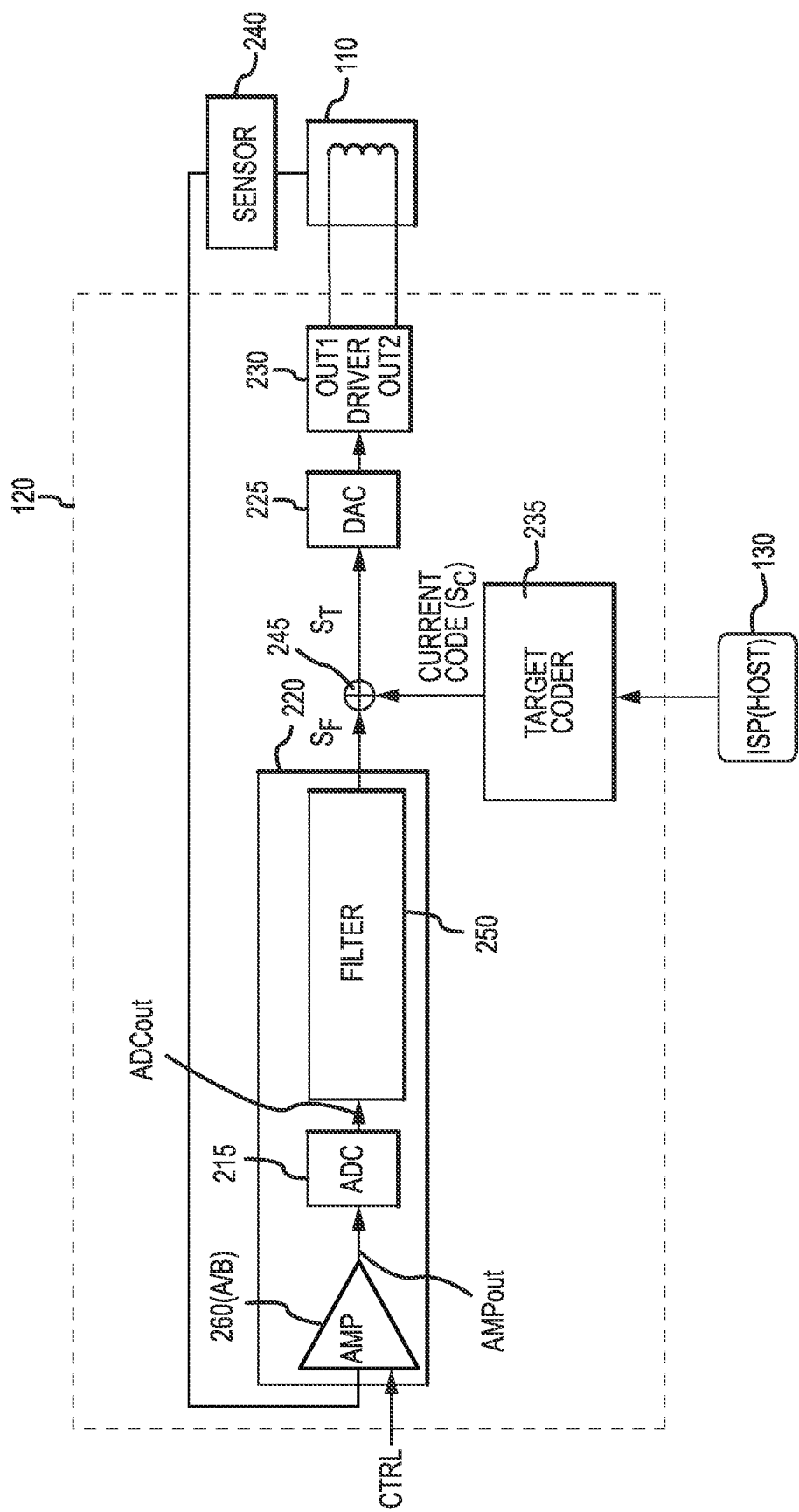
FIG. 2 is a block diagram of a control circuit in accordance with an exemplary application of the present technology.

Methods and apparatus for an amplifier integrated circuit according to various aspects of the present technology may operate in conjunction with any suitable electronic system. For example, and referring to FIGS. 1 and 2, an exemplary system 100 may comprise an autofocus system 105 and an image signal processor (ISP) 130. According to an exemplary embodiment, the autofocus system 105 may be configured to communicatively couple to the ISP 130. The autofocus system 105 may control autofocus functionality in cameras, such as the cameras on smart phones, tablets, laptops and webcams. The ISP 130 may receive and process image data from an image sensor 125.

In various embodiments, the autofocus system 105 may comprise a camera module 115, a control circuit 120, and the image sensor 125. According to an exemplary embodiment, the image sensor 125 may be configured to communicatively couple to the control circuit 120, the ISP 130 may be configured to communicatively couple to at least one of the image sensor 125 and the control circuit 120, and the control circuit 120 may be configured to send a plurality of output signals, such as a first output signal OUT1 and a second output signal OUT2, to the camera module 115. The image sensor 125 may generate image data using any known method of image sensing. The ISP system 130 may communicate with the control circuit 120 based on data from the image sensor 125. The control circuit 120 may be configured to generate the first and second output signals OUT1, OUT2 and transmit them to the camera module 115 based on input data received from the image sensor 125 and/or the ISP 130. The image sensor 125 may utilize any known method for image sensing such as charge-coupled devices, digital radiography, fluoroscopy, computerized tomography, digital scintigraphy, single-photon emission computer tomography, positron-emission tomography, ultrasonography, sonar and radar.

In various embodiments, the camera module 115 may comprise an actuator 110 and a lens 135. According to an exemplary embodiment, the actuator 110 may receive the plurality of output signals (e.g., OUT1, OUT2) from the control circuit 120 and be configured to actuate the lens 135 in response to these signals. The lens 135 may comprise any known material used for collecting and focusing light such as glass, plexiglass, plastics, polymers, and high refractive index materials. In addition, the lens 135 may comprise one or more individual lens.

The actuator 110 may be configured to move the lens 135 by tilting, rotating, translating, or other motive action to zoom in, zoom out, focus, or otherwise adjust the captured image. For example, in embodiments where the lens 135 may comprise multiple individual lenses, the actuator 110 may change the distance between a pair of lenses to change the focal point. The actuator 110 may be configured to communicatively couple with the sensor 240.

The control circuit 120 may be configured to control the actuator 110 by processing data received from the actuator 110 and by managing instructions from the ISP 130. For example, the control circuit 120 may comprise a feedback circuit 220, a target coder 235, a computation circuit 245, a digital-to-analog converter (DAC) 225, and a driver 230. The control circuit 120 may be configured to receive a signal from the ISP 130 at the target coder 235.

In various embodiments, the system 100 may further comprise a sensor 240 configured to detect a position and generate position data. For example, the sensor 240 may comprise a hall sensor or any other device or system suitable for detecting the position of the lens 135 and/or the actuator 110. The control circuit 120 may use the position data as a feedback signal to further control the first and second output signals OUT1, OUT2. For example, the sensor 240 may be configured to transmit a position signal to the feedback circuit 220.

The target coder 235 may be configured to generate a position code Sc that corresponds to a desired current. For example, the target coder 235 may be configured to receive data from the ISP 130 and generate the position code Sc according to the data from the ISP 130. The target coder 235 may utilize any method for generating desired position data based on the image sensor 125 data and/or the data from the ISP 130. In various embodiments, the target coder 235 may comprise a storage device, such as a register, and/or other processing circuitry adapted to generate desired position information.

The DAC 225 may be configured to convert a digital signal into an analog signal.

For example, the DAC 225 may receive the signal $S_T$ and convert the signal $S_T$ into a DAC output signal. In addition, the DAC 225 may transmit the DAC output signal to the driver 230. The DAC 225 may comprise any type of DAC such as a pulse-width modulator, delta-sigma modulator, binary-weighted DAC, cyclic DAC, thermometer-coded DAC or hybrid DAC.

The driver 230 may be configured to interface between the control circuit 120 and any connected hardware. For example, the driver 230 may receive the analog signal from the DAC 225 and generate one or more output signals to drive the actuator 110. The driver 230 may comprise any known driver architecture for processing analog signals to drive the actuator 110.

The feedback circuit 220 may be configured to provide feedback data to the control circuit 120 to make adjustments and corrections. For example, the feedback circuit 220 may receive the position data from the sensor 240 and generate a feedback signal $S_F$ according to the data from the sensor 240. In addition, the feedback circuit 220 may transmit the feedback signal $S_F$ to a computation circuit 245, such as an adder circuit. In an exemplary embodiment, the feedback circuit 220 may comprise an analog-to-digital converter (ADC) 215, a filter 250, and an amplifier integrated circuit (amplifier IC) 260(A/B).

The computation circuit 245 may be configured to provide the DAC 225 a combined signal from the feedback circuit 220 and the target coder 235. For example, the computation circuit 245 may compute a signal $S_T$ from the position code Sc generated by the target coder 235 and the feedback signal $S_F$ output from the feedback circuit 220. The computation circuit may be configured to perform a variety of computations dependent upon the application, such as an adder circuit, a subtractor circuit, decrement circuit, multiplication circuit, arithmetic divider circuit, integrator circuit or differentiator circuit.

The ADC 215 converts an analog signal into a digital signal. For example, the ADC 215 may be connected to an output terminal of the amplifier IC 260(A/B) and generate an ADC output signal according to the amplifier output signal. The ADC 215 may be further configured to transmit the ADC output signal to the filter 250. The ADC 215 may comprise any type of ADC such as a direct-conversion ADC, successive-approximation ADC, ramp-compare ADC, Wilkinson ADC, integrating ADC, delta-encoded ADC, pipelined ADC, sigma-delta ADC, time-interleaved ADC or intermediate FM stage ADC.

The filter 250 may be configured to filter out undesired signals. For example, the filter 250 may be configured to filter out undesired signals received from the ADC 215, transmitting only the desired signals to the computation circuit 245. The filter 250 may comprise one or more of a variety of known filters such as high-pass, low-pass, band-pass, stop-band, notch, comb, all-pass, or any other known filter.

Figure 3:
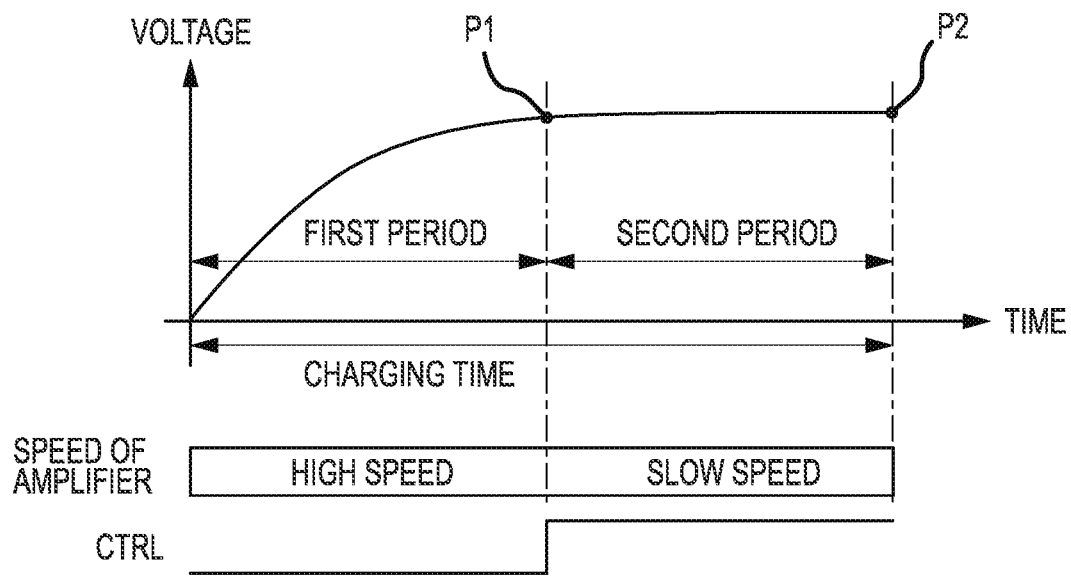
FIG. 3 is a graph illustrating charging of a capacitor in accordance with an exemplary embodiment of the present technology.
Figure 4:
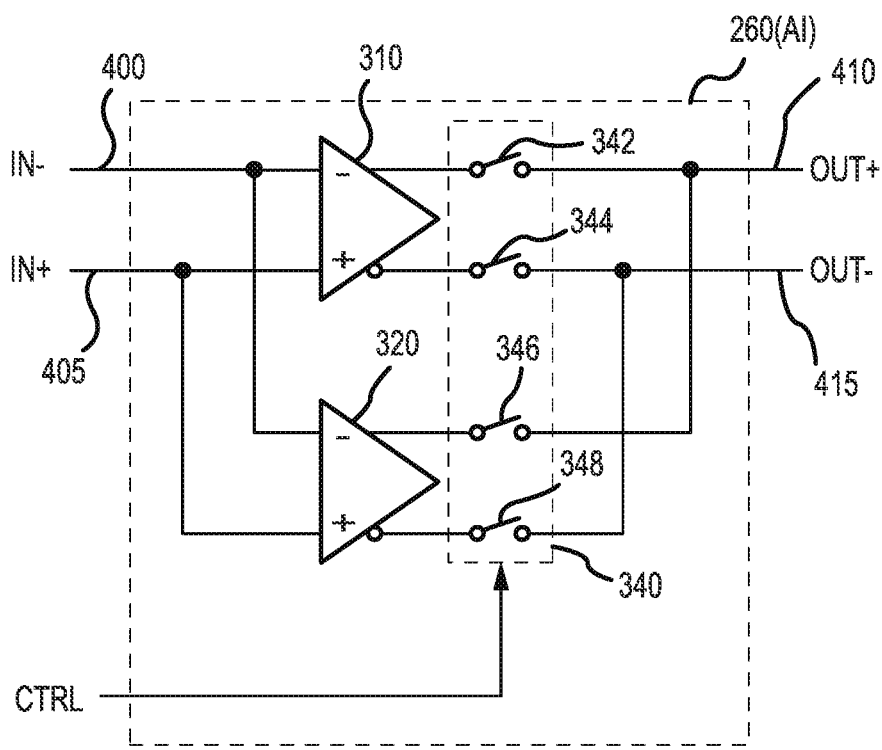
FIG. 4 is a circuit diagram of an amplifier integrated circuit in accordance with a first embodiment of the present technology.
Figure 12:
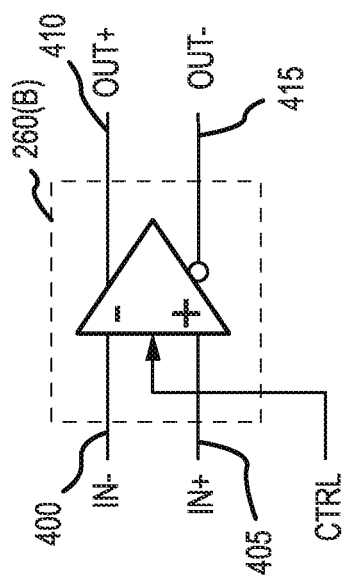
FIG. 12 is a block diagram of an amplifier integrated circuit in accordance with a second embodiment of the present technology.

Referring to FIGS. 3, 4, and 12, the amplifier IC 260(A/B) may be configured to amplify a signal received from the sensor 240 in multiple speed modes operating at various gain bandwidth products. For example, the amplifier IC 260(A/B) may be configured to transmit an output to the ADC 215. In various embodiments, the amplifier IC 260(A/B) may be used to charge a switched capacitor (not shown).

According to various embodiments, the amplifier IC 260(A/B) may provide multiple gain bandwidth products, each corresponding to a particular speed, such as a high speed mode and a low speed mode. Accordingly, the amplifier IC 260(A/B) may be utilized to charge the switched capacitor at different speeds. In this way, the switched capacitor may be charged quickly and with low thermal noise. In various embodiments, the amplifier IC 260(A/B) may comprise one or more amplifiers that operate in conjunction with one or more switching circuits to achieve a desired operating speed.

In other exemplary embodiments, the amplifier circuit 260(A/B) may be configured to operate at more than two operating speeds, starting at a highest speed and decreasing the speed over time to slower speeds. Reconfiguring an amplifier while it is deactivated, using additional amplifiers for different speeds, or using different amplifiers for different speeds and reconfiguring those amplifiers while they are deactivated may achieve any number of desired speeds.

In various embodiments, the amplifier IC 260(A/B) may be configured to receive a first input signal IN+ and a second input signal IN− and generate a first output signal OUT+ and a second output signal OUT− based on the input signals IN+, IN−. For example, the amplifier IC 260(A/B) may comprise a first input terminal 400 and a second input terminal 405 to receive the first and second input signals IN+, IN−, respectively. In addition, the amplifier IC 260(A/B) may comprise a first output terminal 410 and a second output terminal 415 to transmit the first and second output signals OUT+, OUT−, respectively.

In various embodiments, the amplifier IC 260(A/B) may receive a control signal CTRL to control the gain bandwidth product output and/or operating speed of the amplifier IC 260(A/B). For example, the control signal CTRL may comprise a binary signal having a LOW value or a HIGH value.

Referring now to FIG. 3, in an exemplary application, the amplifier circuit 260(A/B) may operate in the high speed mode during a first period from t=0 to t=P1.

Accordingly, the switched capacitor is quickly charged to a desired voltage at time t=P1. The amplifier circuit 260(A/B) may then operate in the low speed mode from t=P1 to t=P2. Accordingly, the switched capacitor is fully charged at the time t=P2.

In general, an amplifier operating at higher speed greatly amplifies thermal noise, while an amplifier operating at lower speed only slightly amplifies thermal noise. The thermal noise of the amplifier circuit 260(A/B) may be represented as follows: $V_n = \sqrt{4kTRGBW}$, where k is the Boltzmann constant, T is temperature, R is resistance, and GBW is gain bandwidth product. When the gain bandwidth product is reduced by an order of magnitude, such as from GBW=1.250 MHz to GBW=0.125 MHz, the new thermal noise is $$V'_n = \frac{\sqrt{4kTRGBW}}{\sqrt{10}},$$

reducing thermal noise by a factor of $\sqrt{10}$.

Figure 8:
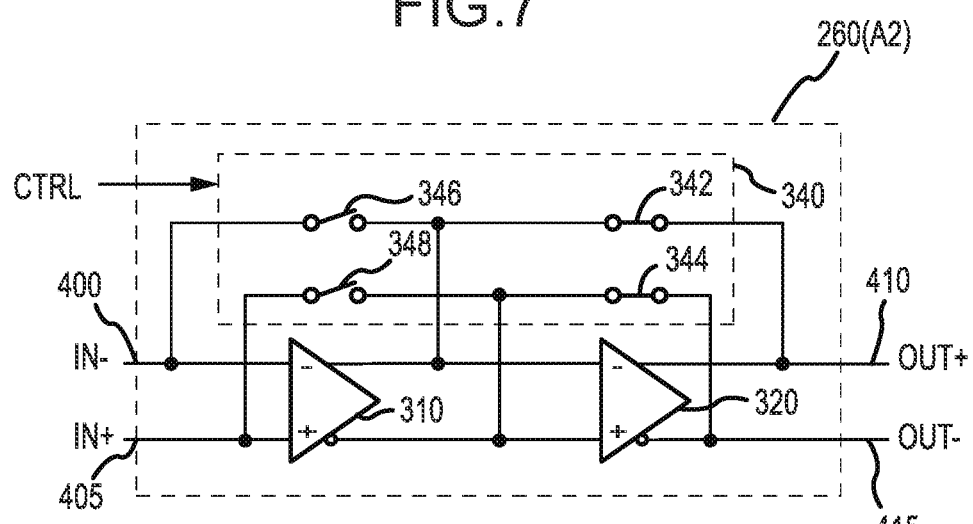
FIG. 8 is a circuit diagram of the amplifier integrated circuit of FIG. 7 operating in a high speed mode.
Figure 9:
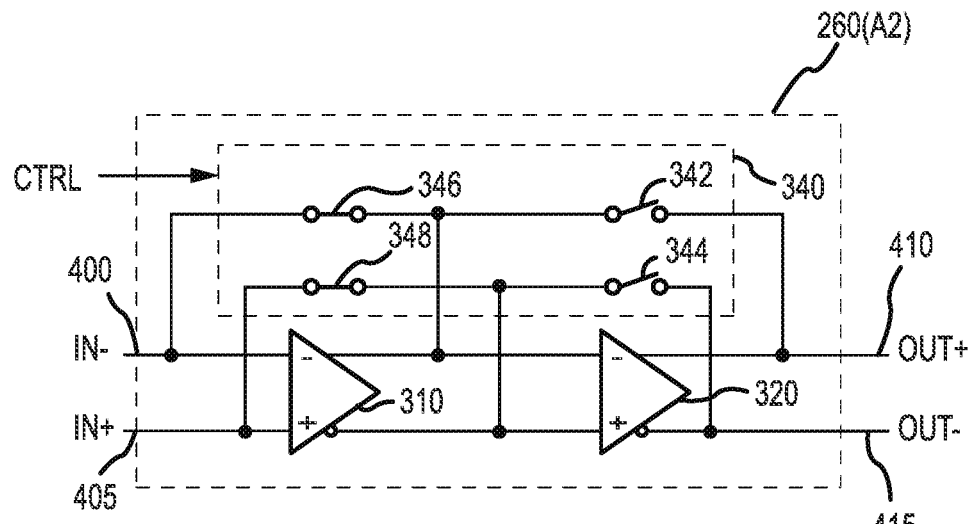
FIG. 9 is a circuit diagram of the amplifier integrated circuit of FIG. 7 operating in a low speed mode.
Figure 10:
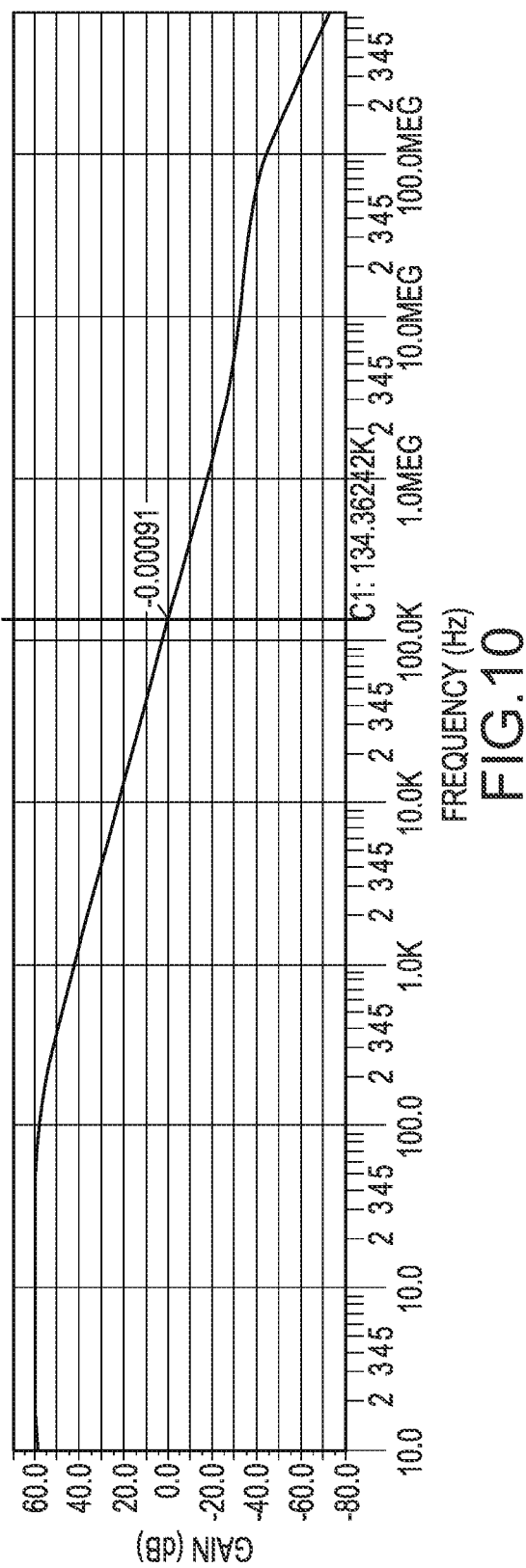
FIG. 10 is a graph illustrating a frequency response and a first gain bandwidth product of a first amplifier in accordance with an exemplary embodiment of the present technology.
Figure 11:
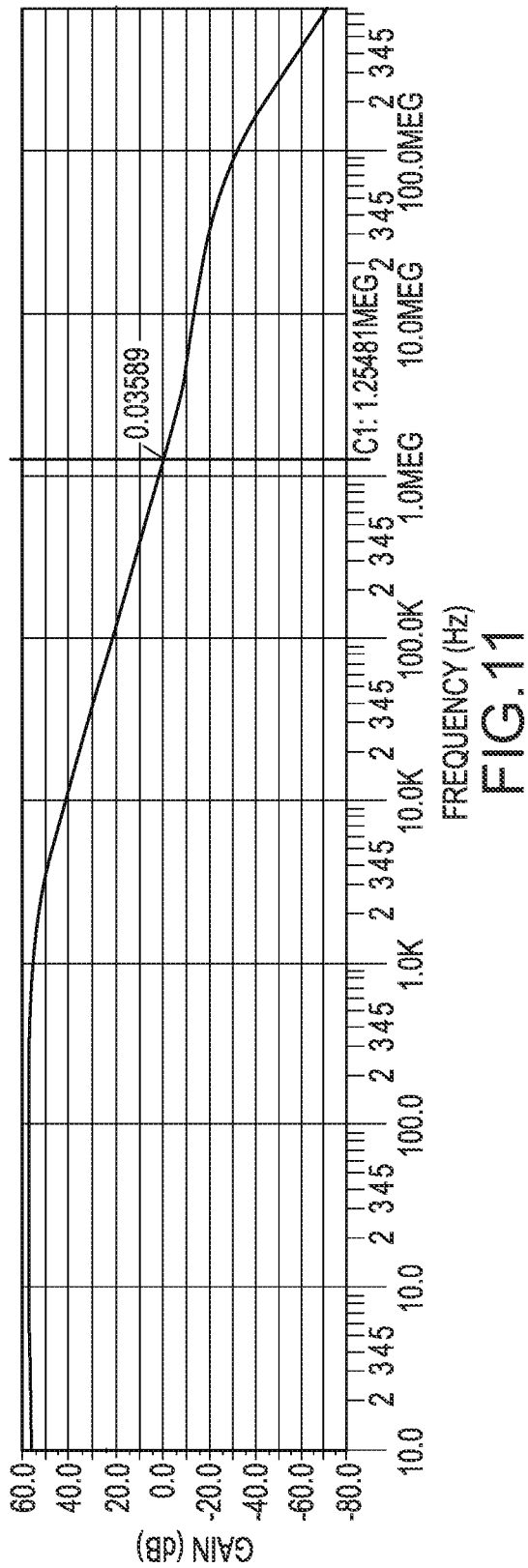
FIG. 11 is a graph illustrating a frequency response and a second gain bandwidth product of a second amplifier in accordance with an exemplary embodiment of the present technology.

In a first embodiment and referring to FIGS. 3-11, the amplifier circuit 260(A) may comprise a plurality of amplifiers, such as a first amplifier 310 and a second amplifier 320, and a switching circuit 340. The first and second amplifiers 310, 320 and the switching circuit 340 may be arranged in any configuration suitable for selectively activating one amplifier to provide a particular operating speed. For example, the first amplifier 310 may provide a first gain bandwidth product (GBW), such as a GBW of 1.25 MHz (for example, as illustrated in FIG. 11) and the second amplifier 320 may provide a second gain bandwidth product, such as a GBW of 134 kHz (for example, as illustrated in FIG. 10). The first bandwidth product may correspond to a faster operating speed (i.e., a high speed mode) and the second bandwidth product may correspond to a slower operating speed (i.e., a low speed mode).

Figure 5:
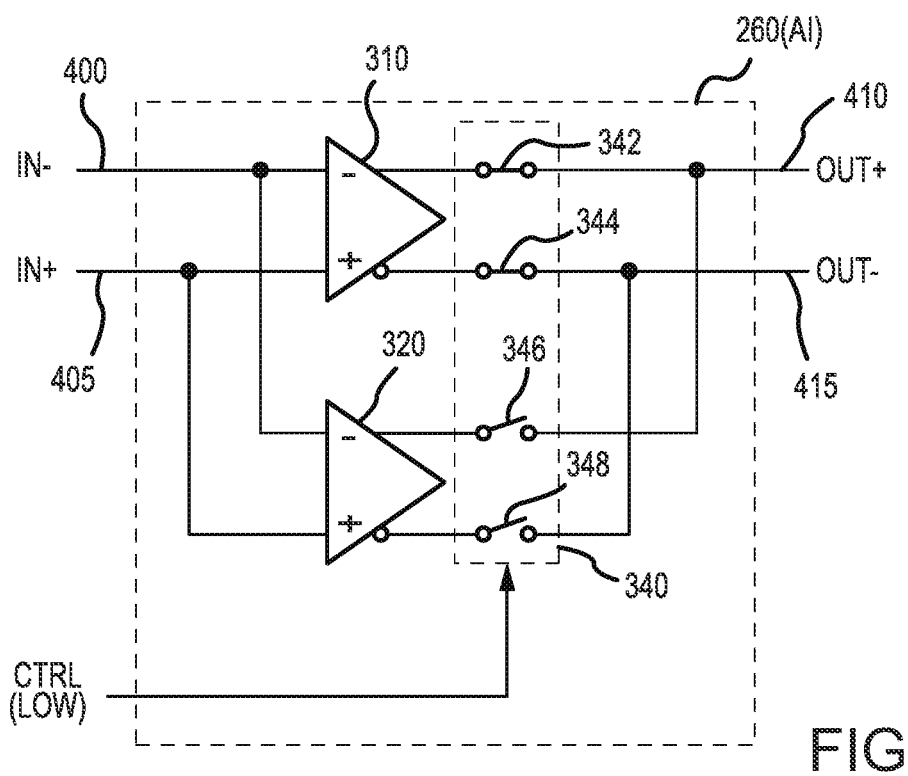
FIG. 5 is a circuit diagram of the amplifier integrated circuit of FIG. 4 operating in a high speed mode.
Figure 6:
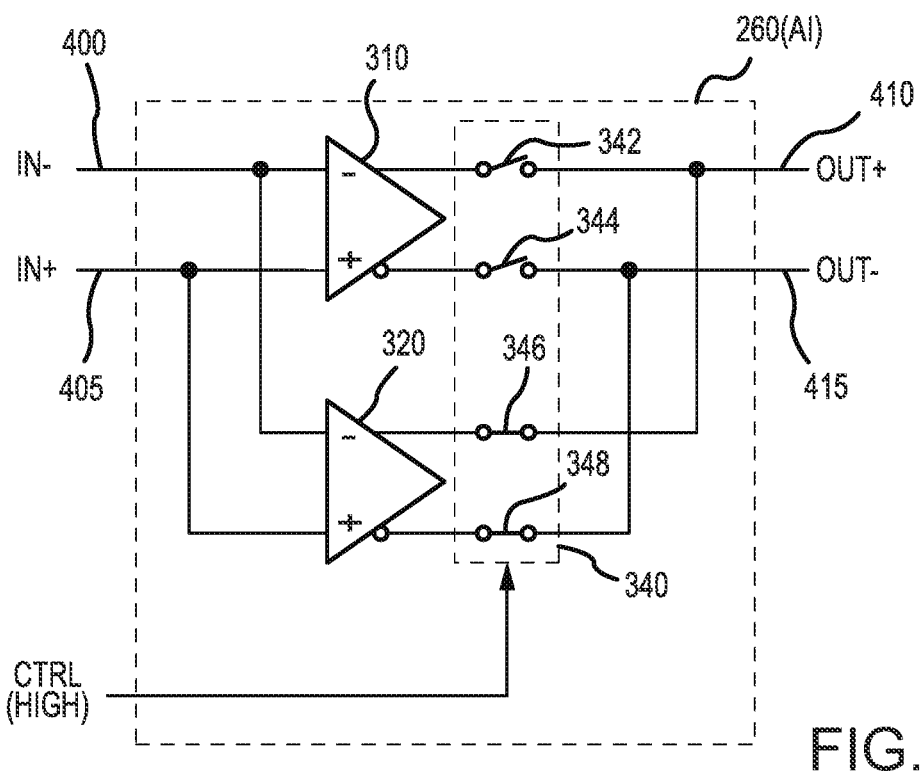
FIG. 6 is a circuit diagram of a the amplifier integrated circuit of FIG. 4 operating in a low speed mode.

In a first arrangement of the amplifier IC 260(A1), and referring to FIGS. 4-6, the first and second amplifiers 310, 320 may be coupled in parallel. Each amplifier 310, 320 may comprise two input terminals, such as an inverting terminal (−) and a non-inverting terminal (+). Both non-inverting terminals (+) may be configured to receive the first input signal IN+ and both inverting terminals (−) may be configured to receive the second input signal IN−. In addition, each amplifier 310, 320 may comprise two output terminals, such as a positive output terminal and a negative output terminal. In the present embodiment, the output terminals of each amplifier 310, 320 may couple to the switching circuit 340.

In the present arrangement, the switching circuit 340 may selectively couple and decouple the first amplifier 310 output terminals and the second amplifier 320 output terminals to and from the first and second output terminals 410, 415.

The first switch 342 and the second switch 344 may be arranged between the outputs of the first amplifier 310 and the first and second output terminals 410, 415. For example, the first switch 342 may selectively couple the first amplifier 310 negative output terminal to the first output terminal 410, and the second switch 344 may selectively couple the first amplifier 310 positive output terminal to the second output terminal 415.

The third switch 346 and the fourth switch 348 may be arranged between the output terminals of the second amplifier 320 and the output terminals OUT+, OUT−. For example, the third switch 346 may selectively couple the second amplifier 320 negative output terminal to the first output terminal 410, and the fourth switch 348 may selectively couple the second amplifier 320 positive output terminal to the second output terminal 415. In the present embodiment, when all switches are closed the first amplifier 310 and the second amplifier 320 are connected in parallel.

In the present arrangement, when the first switch 342 and the second switch 344 open, the first amplifier 310 has both outputs at open circuit, deactivating the first amplifier 310. When the first switch 342 and the second switch 344 close, the first amplifier 310 has both outputs connected to their respective output terminals 410, 415, activating the first amplifier 310. When the third switch 346 and the fourth switch 348 open, the second amplifier 320 has both outputs at open circuit, deactivating the second amplifier 320. When the third switch 346 and the fourth switch 348 close, the second amplifier 320 has both outputs connected to their respective output terminals 410, 415, activating the second amplifier 320.

In present arrangement and referring to FIG. 5, when the control signal CTRL is LOW, the first and second switches 342, 344 may be closed, while the third and fourth switches 346, 348 may be open, which activates the first amplifier 310 and deactivates the second amplifier 320. Accordingly, the amplifier IC 260(A1) is operating in the high speed mode. In contrast, and referring to FIG. 6, when the CTRL control signal is HIGH, the first and second switches 342, 344 may be open, while the third and fourth switches 346, 348 may be closed, which deactivates the first amplifier 310 and activates the second amplifier 320. Accordingly, the amplifier IC 260(A1) is operating in the low speed mode.

Figure 7:
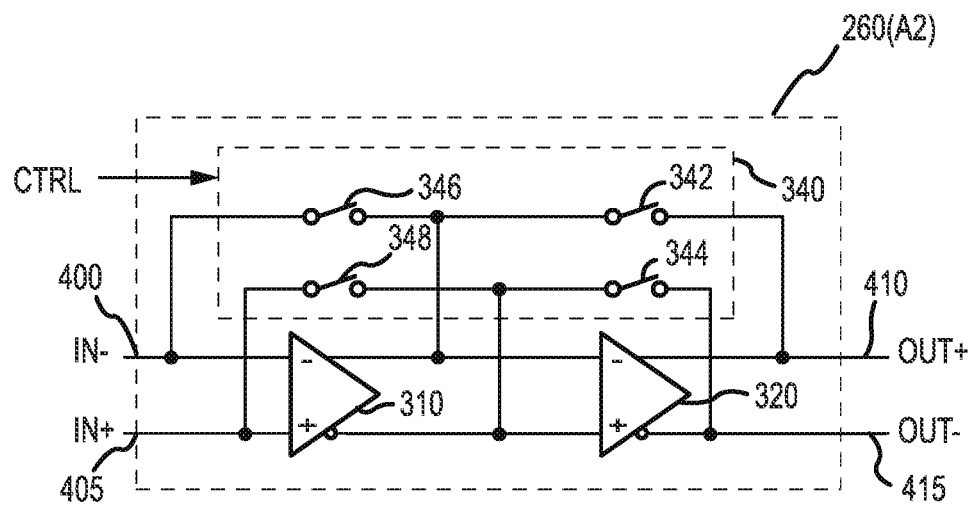
FIG. 7 is a circuit diagram of an amplifier integrated circuit in accordance with a second embodiment of the present technology.

In an alternative arrangement and, referring to FIGS. 7-9, the amplifier IC 260(A2) comprises the first amplifier 310 connected in series with the second amplifier 320. The first amplifier 310 may be configured to receive the first and second input signals IN+, IN− via the first and second input terminals 400, 405. The positive output terminal of the first amplifier 310 may be coupled to the non-inverting terminal of the second amplifier 320. The negative output terminal of the second amplifier 320 may be coupled to the first output terminal 410, and the positive output terminal of the second amplifier 320 may be coupled to the second output terminal 415.

In the present arrangement, all of the inputs and outputs of each the first amplifier 310 and the second amplifier 320 may be coupled to the switching circuit 340. For example, the switching circuit 340 may selectively couple and decouple the non-inverting terminals from both the first amplifier 310 and the second amplifier 320 to and from the second input terminal 405. The switching circuit 340 also may selectively couple and decouple the inverting terminals from both the first and second amplifiers 310, 320 to and from the first input terminal 400.

The first switch 342 and the second switch 344 may be configured to connect in parallel to the second amplifier 320. The first and second switches 342, 344 may selectively couple the outputs of the first amplifier 310 to the output terminals 410, 415, and the third and fourth switches 346, 348 may selectively couple the input terminals 400, 405 to the inputs of the second amplifier 320.

In the present arrangement, when the first switch 342 and the second switch 344 close, the second amplifier 320 is short circuited, deactivating the second amplifier 320. When the first switch 342 and the second switch 344 open, the second amplifier 320 is not short circuited, activating the second amplifier 320. When the third switch 346 and the fourth switch 348 close, the first amplifier 310 is short circuited, deactivating the first amplifier 310. When the third switch 346 and the fourth switch 348 open, the first amplifier 310 is not short circuited, activating the first amplifier 310.

In the present arrangement, and referring to FIGS. 8 and 9, when the CTRL control signal is LOW, the first and second switches 342, 344 may be closed and the third and fourth switches 346, 348 may be open, which activates the first amplifier 310 by connecting the output terminals of the first amplifier 310 to the output terminals 410, 415 and deactivates the second amplifier 320. Accordingly, the amplifier IC 260(A2) is operating in the high speed mode.

In contrast, when the control signal CTRL is HIGH, the first and second switches 342, 344 may be open and the third and fourth switches 346, 348 may be closed, which activates the second amplifier 320 by connecting the input terminals 400, 405 to the input terminals of the second amplifier 320 and deactivates the first amplifier 310 by disconnecting the output terminals of the first amplifier 310 from the output terminals 410, 415. Accordingly, the amplifier IC 260(A2) is operating in the low speed mode.

In a second embodiment and referring to FIGS. 10-16, the amplifier IC 260(B) may be configured to provide a first gain bandwidth product (GBW), such as a GBW of 1.25 MHz (for example, as illustrated in FIG. 11) and a second gain bandwidth product, such as a GBW of 134 kHz (for example, as illustrated in FIG. 10). The first gain bandwidth product may correspond to a faster operation speed and the second gain bandwidth product may correspond to a slower operation speed.

In the present embodiment, the amplifier IC 260(B) may comprise multiple switching circuits and a plurality of transistors with a variety of input signals, output signals, bias signals, and groundings. For example, the amplifier IC 260(B) may comprise a first switching circuit 440(A), a second switching circuit 440(B), a first IN+ transistor 501, a second IN+ transistor 502, a first IN− transistor 503, a second IN− transistor 504, a first t1 transistor 511, a second t1 transistor 512, a third t1 transistor 513, a fourth t1 transistor 514, a fifth t1 transistor 515, a sixth t1 transistor 516, a first t2 transistor 521, a second t2 transistor 522, a third t2 transistor 523, a fourth t2 transistor 524, a first t3 transistor 531, a second t3 transistor 532, a third t3 transistor 533, a fourth t3 transistor 534, a t4 transistor 541, a VCOM transistor 542, a CMFB transistor 543, a VCOM ground transistor 544, a CMFB ground transistor 545, a first t5 transistor 551, a second t5 transistor 552, a third t5 transistor 553, and a fourth t5 transistor 554.

Each transistor may comprise a gate terminal and two source/drain terminals. Operation of the transistors may be illustrated using switches.

Several of the above listed transistors may be coupled to a common node. A first bias signal "Bias 1" may be applied to a first node T1. A second bias signal "Bias 2" may be applied to a second node T2. A third bias signal "Bias 3" may be applied to a third node T3. A fourth bias signal "Bias 4" may be applied to a fourth node T4. A fifth node T5 may be defined to more clearly indicate the configuration of amplifier IC 260(B) transistors. A supply voltage VDD may be applied to a sixth node T0.

The first switching circuit 440(A) may comprise a first switch 441, a second switch 442, a third switch 443, and a fourth switch 444. The second switching circuit 440(B) may comprise a fifth switch 445, a sixth switch 446, a seventh switch 447, and an eighth switch 448.

In an exemplary embodiment, system 100 may generate sub-signals, such as a first signal A and a second signal B, according to the control signal CTRL. For example, the system 100 may comprise a signal generator circuit 1400 comprising a first inverter 561 in series with a second inverter 562. The first switching circuit 440(A) and the second switching circuit 440(B) may be controlled by the control signal CTRL and/or the sub-signals.

In an exemplary embodiment, the output of the first inverter 561 may be configured to couple to the first switching circuit 440(A) and the second switching circuit 440(B). The signal output by the first inverter 561 may be the first signal A. The output of the first inverter 561 may also be configured to couple to the input of a second inverter 562. The output of the second inverter 562 may be configured to couple to the first switching circuit 440(A) and the second switching circuit 440(B). The signal output by the second inverter 562 may be the second signal B. Accordingly, in some embodiments when the control signal CTRL is high, the second signal B is HIGH and the first signal A is LOW. When the control signal CTRL is LOW, the second signal B is LOW and first signal is HIGH.

In particular, the output of the first inverter 561 may be configured to couple to the gate of the third switch 443, the fourth switch 444, the seventh switch 447, and the eighth switch 448. The output of the second inverter 562 may be configured to couple to the gate of the first switch 441, the second switch 442, the fifth switch 445, and the sixth switch 446.

Figure 14:
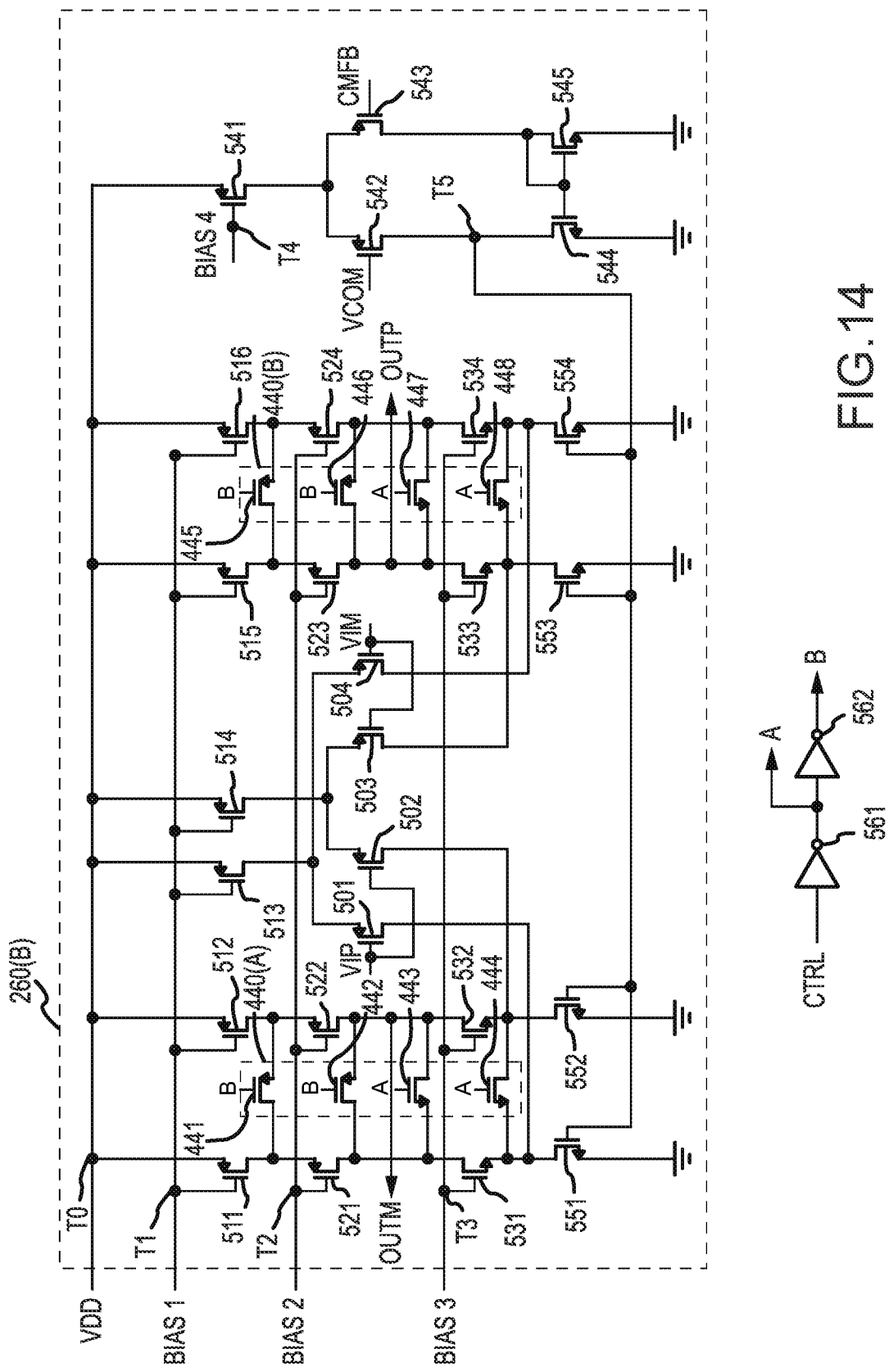
FIG. 14 is a circuit diagram of the amplifier integrated circuit of the FIG. 12 in accordance with an exemplary embodiment of the present technology.
Figure 15:
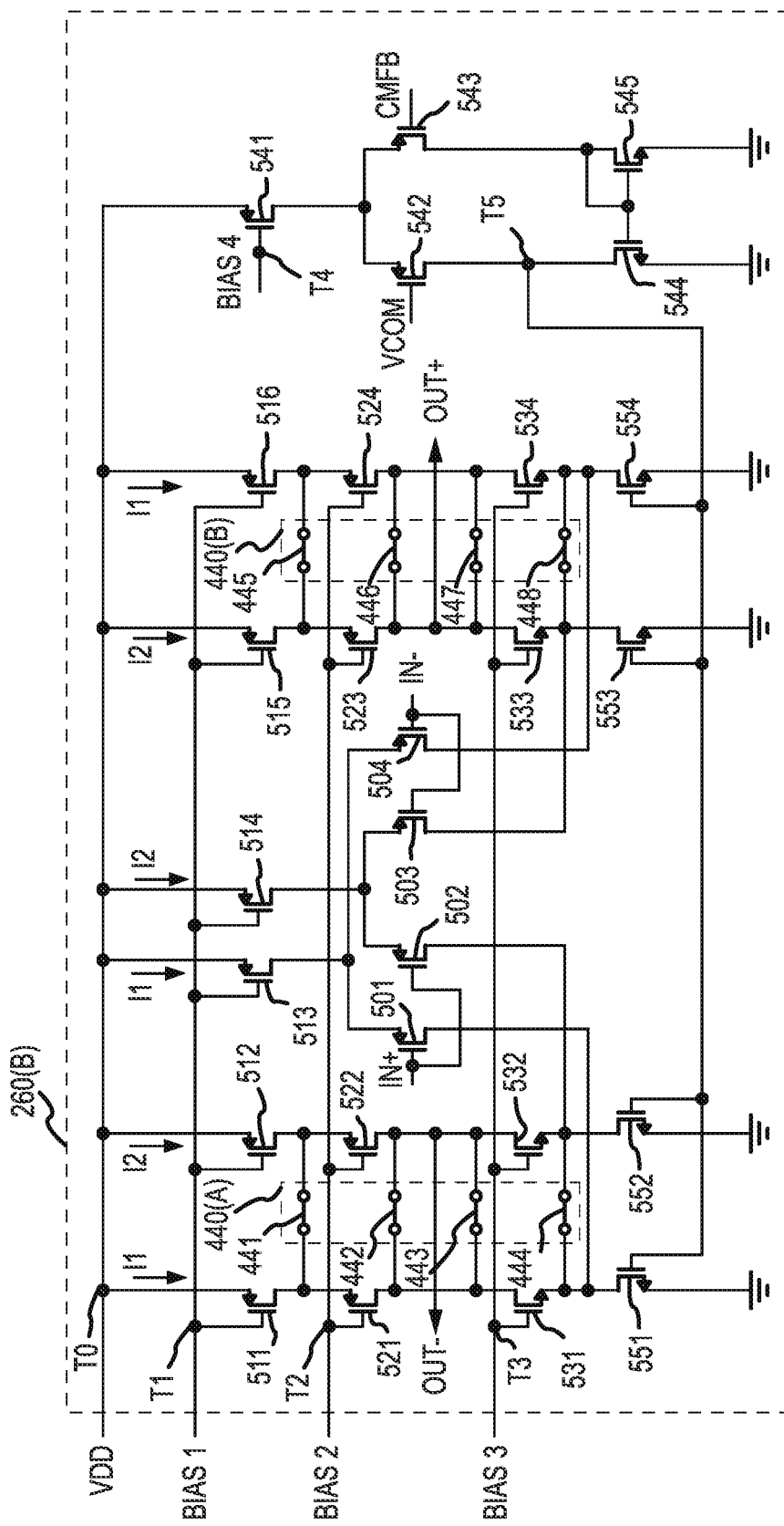
FIG. 15 is an equivalent circuit diagram of the amplifier integrated circuit of FIG. 12 operating in a high speed mode and in accordance with present technology.
Figure 16:
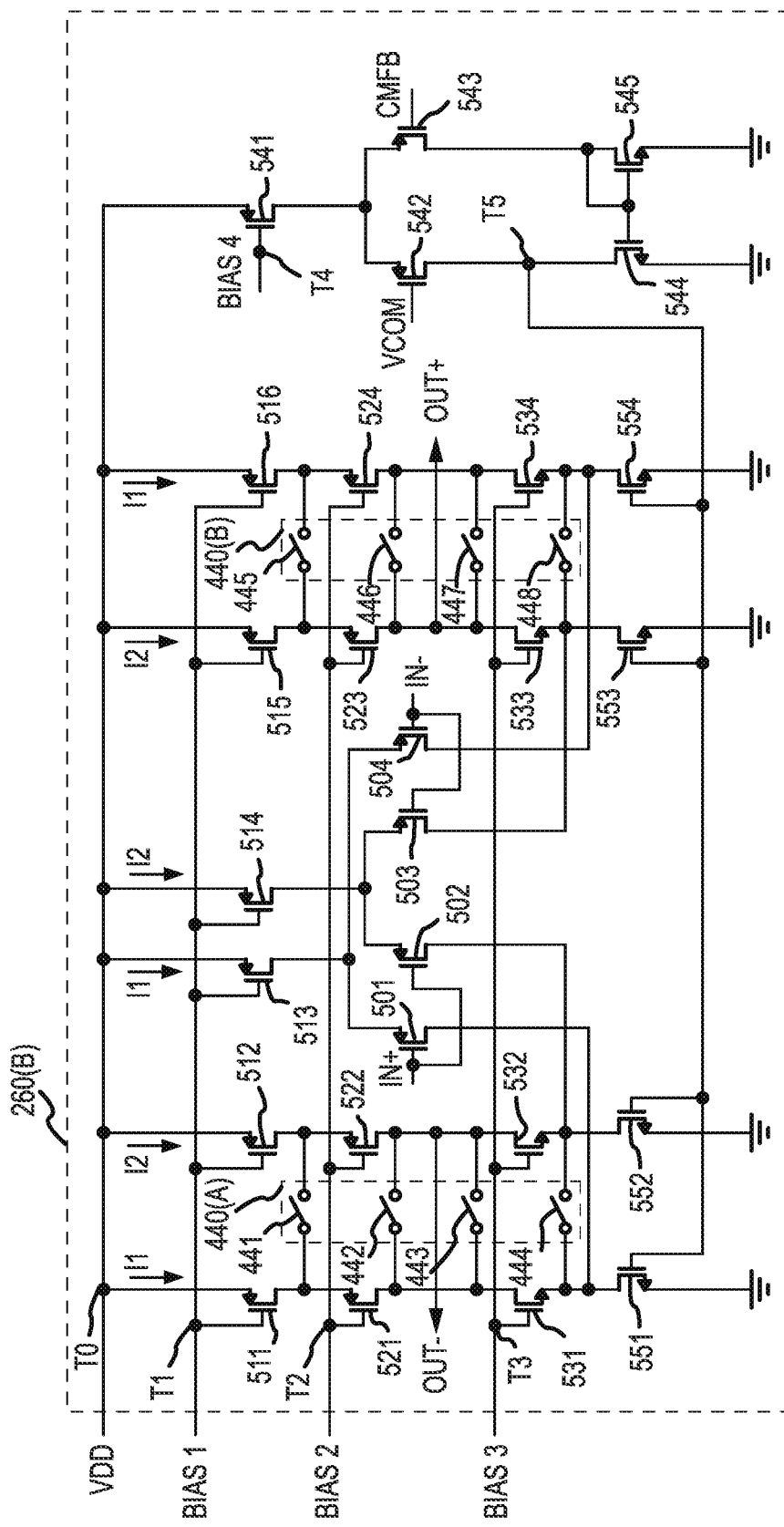
FIG. 16 is an equivalent circuit diagram of the amplifier integrated circuit of FIG. 12 operating in a low speed mode and in accordance with the present technology.

In some exemplary embodiments, referring now to FIGS. 14-16, the first t1 transistor 511, the second t1 transistor 512, the third t1 transistor 513, the fourth t1 transistor 514, the fifth t1 transistor 515, the sixth t1 transistor 516, and the t4 transistor 541 may be configured to couple to the sixth node T0. At the sixth node T0, the supply voltage VDD is applied.

The first t1 transistor 511, the second t1 transistor 512, the third t1 transistor 513, the fourth t1 transistor 514, the fifth t1 transistor 515, the sixth t1 transistor 516 may be biased by a first bias signal Bias 1. The first bias signal Bias 1 is applied to the first node T1, which is configured to couple to the gate of each of the first t1 transistor 511, the second t1 transistor 512, the third t1 transistor 513, the fourth t1 transistor 514, the fifth t1 transistor 515, the sixth t1 transistor 516.

The first t2 transistor 521, the second t2 transistor 522, the third t2 transistor 523, and the fourth t2 transistor 524 may be biased by a second bias signal Bias 2. The second bias signal Bias 2 is applied to the second node T2, which is configured to couple to the gate of each of the first t2 transistor 521, the second t2 transistor 522, the third t2 transistor 523, and the fourth t2 transistor 524.

The first t3 transistor 531, the second t3 transistor 532, the third t3 transistor 533, and the fourth t3 transistor 534 may be biased by a third bias signal Bias 3. The third bias signal Bias 3 is applied to the third node T3, which is configured to couple to the gate of each of the first t3 transistor 531, the second t3 transistor 532, the third t3 transistor 533, and the fourth t3 transistor 534.

The t4 transistor 541 may be biased by a fourth bias signal Bias 4. The fourth bias signal Bias 4 is applied to the fourth node T4, which is configured to couple to the gate of the t4 transistor 541.

The t4 transistor 541 may also be configured to couple to the VCOM transistor 542 and the CMFB transistor 543. The VCOM transistor 542 may be biased by a VCOM signal. The VCOM signal is applied to a gate terminal of the VCOM transistor 542. The CMFB transistor 542 may be biased by a CMFB signal. The CMFB signal is applied to a gate terminal of the CMFB transistor 543.

The CMFB transistor 543 may also be configured to couple to the CMFB ground transistor 545. The CMFB transistor 543 may also be configured to couple to the gate of each of the CMFB ground transistor 545 and the VCOM ground transistor 544. Each of the CMFB ground transistor 545 and the VCOM ground transistor 545 may also be coupled to a ground potential or other reference potential.

The VCOM transistor 542 may also be configured to couple to the VCOM ground transistor 544 at a fifth node T5. The gate of each of the first t5 transistor 551, the second t5 transistor 552, the third t3 transistor 553, and the fourth t5 transistor 554 may also be configured to couple to the fifth node T5. The first t5 transistor 551, the second t5 transistor 552, the third t3 transistor 553, and the fourth t5 transistor 554 may each also be configured to couple to the ground potential.

The first t1 transistor 511 may also be configured to couple to the first t2 transistor 521. The second t1 transistor 512 may also be configured to couple to the second t2 transistor 522. The terminal that couples the first t1 transistor 511 and the first t2 transistor 521 may also couple to the first switch 441. The terminal that couples the second t1 transistor 512 and the second t2 transistor 522 may also couple to the first switch 441 at a second terminal. In this configuration, the first switch 441 is configured to selectively couple the two terminals together when the switch is closed and configured to selectively decouple the two terminals apart when the switch is open.

The first t2 transistor 521 may also be coupled to the first t3 transistor 531. The second t2 transistor 522 may also be coupled to the second t3 transistor 532. The terminal that couples the second t2 transistor 522 and the second t3 transistor 532 may also couple to an OUT− terminal.

The terminal that couples the first t2 transistor 521 and the first t3 transistor 531 may also couple to the second switch 442. The terminal that couples the second t2 transistor 522 and the second t3 transistor 532 may also couple to the second switch 442. In this configuration, the second switch 442 is configured to selectively couple the two terminals together when the switch is closed and configured to selectively decouple the two terminals apart when the switch is open.

The terminal that couples the first t2 transistor 521 and the first t3 transistor 531 may also couple to the third switch 443. The terminal that couples the second t2 transistor 522 and the second t3 transistor 532 may also couple to the third switch 443. In this configuration, the third switch 443 is configured to selectively couple the two terminals together when the switch is closed and configured to selectively decouple the two terminals apart when the switch is open.

The first t3 transistor 531 may couple to the first t5 transistor 551. The terminal that couples the first t3 transistor 531 and the first t5 transistor 551 may also be coupled to the first IN+ transistor 501. The terminal that couples the first t3 transistor 531 and the first t5 transistor 551 may also be coupled to the fourth switch 444. The second t3 transistor 532 may couple to the second t5 transistor 552. The terminal that couples the second t3 transistor 532 and the second t5 transistor may also be coupled to the second IN+ transistor 502. The terminal that couples second t3 transistor 532 and the second t5 transistor 552 may also be coupled to the fourth switch 444. In this configuration, the fourth switch 444 is configured to selectively couple the two terminals together when the switch is closed and configured to selectively decouple the two terminals apart when the switch is open.

The fifth t1 transistor 515 may also be configured to couple to the third t2 transistor 523. The sixth t1 transistor 516 may also be configured to couple to the fourth t2 transistor 524. The terminal that couples the fifth t1 transistor 515 and the third t2 transistor 523 may also be coupled to the fifth switch 445. The terminal that couples the sixth t1 transistor 516 and the fourth t2 transistor 524 may also be coupled to the fifth switch 445. In this configuration, the fifth switch 445 is configured to selectively couple the two terminals together when the switch is closed and configured to selectively decouple the two terminals apart when the switch is open.

The third t2 transistor 523 may also be coupled to the third t3 transistor 533. The fourth t2 transistor 524 may also be coupled to the fourth t3 transistor 534. The terminal that couples the third t2 transistor 523 and the third t3 transistor 533 may also be coupled to an OUT+ terminal.

The terminal that couples the third t2 transistor 523 and the third t3 transistor 533 may also be coupled to the sixth switch 446. The terminal that couples the fourth t2 transistor 524 and the fourth t3 transistor 534 may also be coupled to the sixth switch 446. In this configuration, the sixth switch 446 is configured to selectively couple the two terminals together when the switch is closed and configured to selectively decouple the two terminals apart when the switch is open.

The terminal that couples the third t2 transistor 523 and the third t3 transistor 533 may also be coupled to the seventh switch 447. The terminal that couples the fourth t2 transistor 524 and the fourth t3 transistor 534 may also be coupled to the seventh switch 447. In this configuration, the seventh switch 447 is configured to selectively couple the two terminals together when the switch is closed and configured to selectively decouple the two terminals apart when the switch is open.

The third t3 transistor 533 may couple to the third t5 transistor 553. The terminal that couples the third t3 transistor and the third t5 transistor 553 may also be coupled to the first IN− transistor 503. The terminal that couples the third t3 transistor and the third t5 transistor 553 may also be coupled to the eighth switch 448. The fourth t3 transistor 534 may couple to the fourth t5 transistor 554. The terminal that couples the fourth t3 transistor 534 and the fourth t5 transistor 554 may also be coupled to the second IN− transistor 504. The terminal that couples the fourth t3 transistor 534 and the fourth t5 transistor 554 may also be coupled to the eighth switch 448. In this configuration, the eighth switch 448 is configured to selectively couple the two terminals together when the switch is closed and configured to selectively decouple the two terminals apart when the switch is open.

The third t1 transistor 513 may couple to the first IN+ transistor 501 and the second IN− transistor 504. The fourth t1 transistor 514 may couple to the second IN+ transistor 502 and the first IN− transistor 503. The first IN+ transistor 501 and the second IN+ transistor 502 may be biased by an IN+ signal. The gate of each the first IN+ transistor 501 and the second IN+ transistor 502 may couple to a IN+ terminal with a IN+ signal applied. The first IN− transistor 503 and the second IN− transistor 504 may be biased by an IN− signal. The gate of each the first IN− transistor 503 and the second IN− transistor 504 may couple to an IN− terminal with an IN− signal applied.

In the previously described embodiments, the amplifier IC 260(B) may be configured to operate at a first gain bandwidth product and a second gain bandwidth product. In other embodiments, the amplifier IC 260(B) may be configured to operate at more than two possible gain bandwidth products, amplifying at more than two speeds in more than two periods. In other embodiments, the amplifier IC 260(B) may scale up to comprise more than two switching circuits 440 by adding more corresponding transistors following the circuit layout pattern.

The first switch 441, the second switch 442, the third switch 443, the fourth switch 444, the fifth switch 445, the sixth switch 446, the seventh switch 447, and the eighth switch 448 may be any known type of electrical switch, such as bipolar junction transistors, power diodes, CMOS, MOSFET, IGBT, SCR, TRIAC, DIAC or Gate Turn-Off Thyristor. Referring now to FIG. 15, in some exemplary embodiments the first switch 441, the second switch 442, the third switch 443, the fourth switch 444, the fifth switch 445, the sixth switch 446, the seventh switch 447, and the eighth switch 448 may be CMOS transistors. In some embodiments the switches may be controlled by two control signals. In the exemplary embodiment illustrated by FIG. 15, the first switch 441, the second switch 442, the fifth switch 445, and the sixth switch 446 may be controlled by a first control signal "A" applied to their respective gates. In the exemplary embodiment illustrated by FIG. 15, the third switch 443, the fourth switch 444, the seventh switch 447, and the eighth switch 448 may be controlled by a second control signal "B" applied to their respective gates.

In some embodiments, the first control signal and the second control signal are generated by an original control signal and an inverter. In the exemplary embodiment illustrated by FIG. 15, the first control signal and the second control signal are generated by an original control signal and a pair of inverters. The original control signal "CTRL" is applied to the input of a first inverter 561. The output of the first inverter 561 carries the inverted CTRL signal "B" which may be applied to the control circuit 120 by coupling to switch gates. The output of the first inverter 561 may also be coupled to the input of a second inverter 562. The output of the second inverter 562 carries the inverted B signal, which is a buffered CTRL signal due to CTRL being inverted twice. The output of the second inverter may be applied to the control circuit 120 by coupling to switch gates.

In some embodiments, the amplifier IC 260(B) may operate at a first gain bandwidth product when all of the switches in the first switching circuit 440(A) and the second switching circuit 440(B) are closed, and the switchable amplifier 260(B) may operate at a second gain bandwidth product when all of the switches in the first switching circuit 440(A) and the second switching circuit 440(B) are open. In some embodiments, the amplifier IC 260(B) may operate in a high speed mode by operating at a first gain bandwidth product and a low speed mode by operating at a second gain bandwidth product.

The exemplary embodiment, the amplifier IC 260(B) may operate in a high speed mode, for example as illustrated by FIG. 15 and may operate in a low speed mode as illustrated by FIG. 16. In the high speed mode, as illustrated by FIG. 15, all of the switches in the first switching circuit 440(A) and the second switching circuit 440(B) are closed. In the low speed mode, as illustrated by FIG. 16, all of the switches in the first switching circuit 440(A) and the second switching circuit 440(B) are open.

Figure 13:
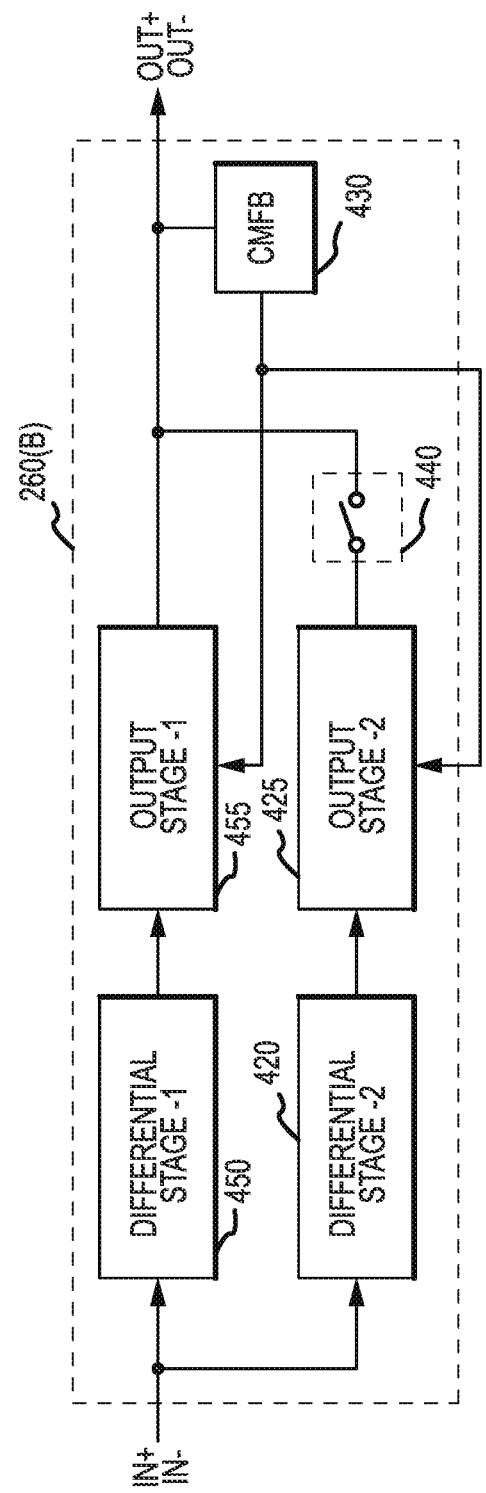
FIG. 13 is an operational block diagram of the amplifier integrated circuit of FIG. 12 and in accordance with an exemplary embodiment of the present technology.

In operation, and referring to FIG. 13, the amplifier IC 260(B) may operate according to a first differential stage 450, a first output stage 455, a second differential stage 420, a second output stage 425, a common mode feedback circuit (CMFB) 430, and a switching circuit 440. The first differential stage 450 and the second differential stage 420 may each be configured to receive at least one of the IN+ and IN− input signals. The first output stage 455 may be configured to couple to the first differential stage 450 and receive the output from the first differential stage 450. The second output stage 425 may be configured to couple to the second differential stage 420 and receive the output from the second differential stage 420. At least one of the first output stage 455 and the second output stage 425 may be configured to couple to the switching circuit 440. At least one of the first output stage 455 and the second output stage 425 may be configured to couple to the CMFB 430.

During the first output stage 455, the switches (e.g., switches 441, 442, 443, 444, 445, 446, 447, 448) may be open and generate a first current I1, such as 150 uA, through transistors 511, 521, 531, 551, 513, 516, 524, 534, and 554, according to the supply voltage VDD, the first bias signal BIAS 1, the second bias signal BIAS 2, and the third bias signal BIAS 3. In other words, transistors 511, 521, 531, 551, 513, 516, 524, 534, and 554 are ON, and transistors 512, 522, 532, 514, 515, 523, 533, and 553 are OFF. Accordingly, the output generated by the amplifier IC 260 (B) during the first output stage 455 is based on the first current I1 and may have a lower gain bandwidth product, compared to the second output stage 425, and therefore operate at a lower speed.

During the second output stage 425, the switches (e.g., switches 441, 442, 443, 444, 445, 446, 447, 448) may be closed and generate the first current I1, such as 150 uA, through transistors 511, 521, 531, 551, 513, 516, 524, 534, and 554, and a second current I2, such as 10 uA, through transistors 512, 522, 532, 514, 515, 523, 533, and 553, according to the supply voltage VDD, the first bias signal BIAS 1, the second bias signal BIAS 2, and the third bias signal BIAS 3. In other words, all transistors 511, 521, 531, 551, 513, 516, 524, 534, 554, 512, 522, 532, 514, 515, 523, 533, and 553 are ON. Accordingly, the output generated by the amplifier IC 260(B) during the first output stage 455 is based on the first current I1 and the second current I2 and may have a higher gain bandwidth product, compared to the first output stage 455, and therefore operate at a higher speed.

In operation, and referring to FIGS. 1-16, an ISP 130 may activate the autofocus system 105. The signals from the ISP 130 and the signals from the image sensor 125 may direct the control circuit 120 by generating the current code in the target coder 235. The current code may be coupled with the feedback signal from the feedback circuit 220 and the DAC 225 may convert it into an analog signal. The DAC 225 may transmit this analog signal to the driver 230, which outputs driving signals to the actuator 110. The sensor 240 may detects the position of the actuator 110, which transmits this sensed data to the amplifier IC 260(A/B). The amplifier IC 260(A/B) may then amplify this analog signal and transmit it to the feedback circuit 220, starting at the ADC 215. The ADC 215 may convert this amplified analog signal to a digital signal, which may then be transmitted to the filter 250. The filter 250 may filter out undesired signals and may then output the desired signal to the DAC 225, completing a feedback loop.

The amplifier IC 260(A/B) amplifies the analog sensed data from the sensor 240 both quickly and with low thermal noise. It achieves this by operating in two modes: the high speed mode with the first amplifier 310 configured to amplify at a low gain bandwidth product, and the low speed mode with the second amplifier 320 configured to amplify at a high gain bandwidth product. In the high speed mode, the high speed amplifier completes most of the electrical charging, and in the low speed mode the low speed amplifier fixes the electrical charge. During the high speed mode, the first amplifier 310 is activated and provides the low gain bandwidth product, while the second amplifier 320 is deactivated. During the low speed mode, the second amplifier 320 is activated and provides the high gain bandwidth product, while the first amplifier 310 is deactivated.

The control signal controlling the switching circuit 340 completes this activation and deactivation by selectively opening and closing the first switch 342, the second switch 344, the third switch 346, and the fourth switch 348. The switching circuit 340 closes the first switch 342, closes the second switch 344, opens the third switch 346, and opens the fourth switch 348, in high speed operation, which activates the first amplifier 310 and deactivates the second amplifier 320. The switching circuit 340 opens the first switch 342, opens the second switch 344, closes the third switch 346, and closes the fourth switch 348, in low speed operation, which deactivates the first amplifier 310 and activates the second amplifier 320.

In the previously described embodiments, the amplifier IC 260(A) may be configured to operate at a first gain bandwidth product and a second gain bandwidth product. In other embodiments, the amplifier IC 260(A) may be configured to operate at more than two possible gain bandwidth products, amplifying at more than two speeds in more than two periods. In other embodiments, the amplifier IC 260(A) may scale up to comprise more switching circuits 340 by adding more corresponding individual amplifiers and control switches to the amplifier IC 260(A) following the circuit layout pattern of activating one specific amplifier for a desired speed mode at a time while deactivating the other amplifiers.

In the foregoing description, the technology has been described with reference to specific exemplary embodiments. The particular implementations shown and described are illustrative of the technology and its best mode and are not intended to otherwise limit the scope of the present technology in any way. Indeed, for the sake of brevity, conventional manufacturing, connection, preparation, and other functional aspects of the method and system may not be described in detail. Furthermore, the connecting lines shown in the various figures are intended to represent exemplary functional relationships and/or steps between the various elements. Many alternative or additional functional relationships or physical connections may be present in a practical system.

The technology has been described with reference to specific exemplary embodiments. Various modifications and changes, however, may be made without departing from the scope of the present technology. The description and figures are to be regarded in an illustrative manner, rather than a restrictive one and all such modifications are intended to be included within the scope of the present technology. Accordingly, the scope of the technology should be determined by the generic embodiments described and their legal equivalents rather than by merely the specific examples described above. For example, the steps recited in any method or process embodiment may be executed in any order, unless otherwise expressly specified, and are not limited to the explicit order presented in the specific examples. Additionally, the components and/or elements recited in any apparatus embodiment may be assembled or otherwise operationally configured in a variety of permutations to produce substantially the same result as the present technology and are accordingly not limited to the specific configuration recited in the specific examples.

Benefits, other advantages and solutions to problems have been described above with regard to particular embodiments. Any benefit, advantage, solution to problems or any element that may cause any particular benefit, advantage or solution to occur or to become more pronounced, however, is not to be construed as a critical, required or essential feature or component.

The terms "comprises", "comprising", or any variation thereof, are intended to reference a non-exclusive inclusion, such that a process, method, article, composition or apparatus that comprises a list of elements does not include only those elements recited, but may also include other elements not expressly listed or inherent to such process, method, article, composition or apparatus. Other combinations and/or modifications of the above-described structures, arrangements, applications, proportions, elements, materials or components used in the practice of the present technology, in addition to those not specifically recited, may be varied or otherwise particularly adapted to specific environments, manufacturing specifications, design parameters or other operating requirements without departing from the general principles of the same.

The present technology has been described above with reference to an exemplary embodiment. However, changes and modifications may be made to the exemplary embodiment without departing from the scope of the present technology. These and other changes or modifications are intended to be included within the scope of the present technology, as expressed in the following claims.

The invention claimed is:

1. An amplifier integrated circuit (IC), comprising:
   a first set of series-connected transistors connected to:
      a first node having a supply voltage potential;
      a second node having a first bias potential;
      a third node having a second bias potential; and
      a fourth node having a third bias potential;
      wherein the first, second, and third bias potentials have values that are different from each other;

a second set of series-connected transistors connected:
  in parallel with the first set of transistors; and
  to the first node;
a third set of series-connected transistors connected to the first node;
a fourth set of series-connected transistors connected:
  in parallel with the third set of transistors; and
  to the first node;
a first switching circuit connecting the first set of transistors to the second set of transistors; and
a second switching circuit connecting the third set of transistors to the fourth set of transistors.

2. The amplifier integrated circuit according to claim 1, wherein:
the second set of transistors is connected to each of the second, third, and fourth nodes;
the third set of transistors is connected to each of the second, third, and fourth nodes; and
the fourth set of transistors is connected to each of the second, third, and fourth nodes.

3. The amplifier integrated circuit according to claim 1, wherein:
a first transistor, from the first set of transistors, comprises a first gate terminal that is connected to the second node;
a second transistor, from the first set of transistors, comprises a second gate terminal that is connected to the third node; and
a third transistor, from the first set of transistors, comprises a third gate terminal that is connected to the fourth node.

4. The amplifier integrated circuit according to claim 1, wherein:
a first transistor, from the second set of transistors, comprises a first gate terminal that is connected to the second node;
a second transistor, from the second set of transistors, comprises a second gate terminal that is connected to the third node; and
a third transistor, from the second set of transistors, comprises a third gate terminal that is connected to the fourth node.

5. The amplifier integrated circuit according to claim 1, wherein:
a first transistor, from the third set of transistors, comprises a first gate terminal that is connected to the second node;
a second transistor, from the third set of transistors, comprises a second gate terminal that is connected to the third node; and
a third transistor, from the third set of transistors, comprises a third gate terminal that is connected to the fourth node.

6. The amplifier integrated circuit according to claim 1, wherein:
a first transistor, from the fourth set of transistors, comprises a first gate terminal that is connected to the second node;
a second transistor, from the fourth set of transistors, comprises a second gate terminal that is connected to the third node; and
a third transistor, from the fourth set of transistors, comprises a third gate terminal that is connected to the fourth node.

7. The amplifier integrated circuit according to claim 1, wherein the first switching circuit comprises:
a first switch connected between a first transistor from the first set of transistors and a first transistor from the second set of transistors;
a second switch connected between a second transistor from the first set of transistors and a second transistor from the second set of transistors;
a third switch connected between a third transistor from the first set of transistors and a third transistor from the second set of transistors; and
a fourth switch connected between a fourth transistor from the first set of transistors and a fourth transistor from the second set of transistors.

8. The amplifier integrated circuit according to claim 1, wherein the second switching circuit comprises:
a first switch connected between a first transistor from the third set of transistors and a first transistor from the fourth set of transistors;
a second switch connected between a second transistor from the third set of transistors and a second transistor from the fourth set of transistors;
a third switch connected between a third transistor from the third set of transistors and a third transistor from the fourth set of transistors; and
a fourth switch connected between a fourth transistor from the third set of transistors and a fourth transistor from the fourth set of transistors.

9. A method for providing an amplifier integrated circuit with variable gain bandwidth product, comprising:
generating a first output with the amplifier integrated circuit according to a first gain bandwidth product, comprising:
  generating a first current through a first set of series-connected transistors and a fourth set of series-connected transistors, comprising:
    applying a plurality of bias potentials to the first and fourth sets of series-connected transistors, wherein bias potentials have different values from each other; and
    applying a supply voltage potential to the first and fourth sets of series-connected transistors; and
generating a second output with the amplifier integrated circuit according to a second gain bandwidth product, comprising:
  generating the first current through the first set of series-connected transistors by applying the plurality of bias potentials and the supply voltage potential to the first set of series-connected transistors; and
  generating a second current through a second set of series-connected transistors and a third set of series-connected transistors, comprising:
    applying the supply voltage potential to the second and third sets of series-connected transistors;
    connecting the first set of transistors to the second set of transistors; and
    connecting the third set of transistors to the fourth set of transistors.

10. The method according to claim 9, wherein:
the plurality of bias potentials comprises:
  a first bias potential;
  a second bias potential; and
  a third bias potential.

11. The method according to claim 10, wherein the values of the plurality of bias potentials remain constant when the amplifier integrated circuit generates the first and second outputs.

12. The method according to claim 11, wherein the amplifier integrated circuit generates the first and second outputs in sequence while the amplifier integrated circuit is ON.

13. A system, comprising:
a sensor configured to generate sensor data;
an amplifier integrated circuit (IC) comprising:
a main input terminal configured to receive the sensor data; and
a main output terminal;
wherein the amplifier IC is configured to:
generate a first output signal according to a first gain bandwidth product; and
generate a second output signal according to a second gain bandwidth product and in sequence with the first output signal while the amplifier IC is ON, wherein the second gain bandwidth is less than the first gain bandwidth product; and
a switched capacitor circuit connected to the main output terminal and configured to charge according to the first and second output signals.

14. The system according to claim 13, wherein the amplifier IC comprises:
a first set of series-connected transistors connected to a first node having a supply voltage potential;
a second set of series-connected transistors connected:
in parallel with the first set of transistors; and
to the first node;
a third set of series-connected transistors connected to the first node;
a fourth set of series-connected transistors connected:
in parallel with the third set of transistors; and
to the first node;
a first switching circuit connecting the first set of transistors to the second set of transistors; and
a second switching circuit connecting the third set of transistors to the fourth set of transistors.

15. The system according to claim 14, wherein:
the first switching circuit comprises:
a first switch connected between a first transistor from the first set of transistors and a first transistor from the second set of transistors;
a second switch connected between a second transistor from the first set of transistors and a second transistor from the second set of transistors;
a third switch connected between a third transistor from the first set of transistors and a third transistor from the second set of transistors; and
a fourth switch connected between a fourth transistor from the first set of transistors and a fourth transistor from the second set of transistors; and
the second switching circuit comprises:
a first switch connected between a first transistor from the third set of transistors and a first transistor from the fourth set of transistors;
a second switch connected between a second transistor from the third set of transistors and a second transistor from the fourth set of transistors;
a third switch connected between a third transistor from the third set of transistors and a third transistor from the fourth set of transistors; and
a fourth switch connected between a fourth transistor from the third set of transistors and a fourth transistor from the fourth set of transistors.

16. The system according to claim 14, wherein the amplifier IC further comprises:
a second node having a first bias potential;
a third node having a second bias potential; and
a fourth node having a third bias potential;
wherein the first, second, and third bias potentials have values that are different from each other.

17. The system according to claim 16, wherein the values of the first, second, and third bias potentials remain constant when the amplifier IC generates the first and second outputs.

18. The system according to claim 16, wherein:
the first set of transistors is connected to each of the second, third, and fourth nodes;
the second set of transistors is connected to each of the second, third, and fourth nodes;
the third set of transistors is connected to each of the second, third, and fourth nodes; and
the fourth set of transistors is connected to each of the second, third, and fourth nodes.

19. The system according to claim 13, wherein the amplifier IC is further configured to charge the switched capacitor for a first period according to the first output signal and charge the switched capacitor for a second period according to the second output signal.

* * * * *